United States Patent
Lam et al.

(10) Patent No.: US 11,362,594 B1
(45) Date of Patent: Jun. 14, 2022

(54) RADIATION TOLERANT GATE DRIVE SCHEME FOR ACTIVE-CLAMP RESET FORWARD TOPOLOGY WITH ACTIVE-DRIVEN SYNCHRONOUS RECTIFICATION

(71) Applicant: Crane Electronics, Inc., Lynnwood, WA (US)

(72) Inventors: Cuon Lam, Renton, WA (US); Ryan Ricchiuti, Edmonds, WA (US); Reza Ahmadi, Kirkland, WA (US); Sovann Song, Kent, WA (US)

(73) Assignee: Crane Electronics, Inc., Lynnwood, WA (US)

( * ) Notice: Subject to any disclaimer, the term of this patent is extended or adjusted under 35 U.S.C. 154(b) by 0 days.

(21) Appl. No.: 17/471,006

(22) Filed: Sep. 9, 2021

(51) Int. Cl.
*H02M 3/335* (2006.01)
*H02M 1/32* (2007.01)
*H02M 1/08* (2006.01)

(52) U.S. Cl.
CPC ......... *H02M 3/33592* (2013.01); *H02M 1/08* (2013.01); *H02M 1/32* (2013.01)

(58) Field of Classification Search
CPC ....... H02M 3/33592; H02M 1/08; H02M 1/32
See application file for complete search history.

(56) References Cited

U.S. PATENT DOCUMENTS

| | | | |
|---|---|---|---|
| 9,293,999 B1 | 3/2016 | Lam et al. | |
| 9,866,100 B2 | 1/2018 | Lam et al. | |
| 10,425,080 B1 | 9/2019 | Lam et al. | |
| 2015/0326103 A1* | 11/2015 | Choi | H02M 1/36 363/21.02 |
| 2015/0364984 A1* | 12/2015 | Miyauchi | H02M 7/5387 363/132 |
| 2015/0365003 A1 | 12/2015 | Sadwick | |

OTHER PUBLICATIONS

K T, et al, "Hardware Implementation of Synchronous Forward Converter with Active Clamp Reset Technique," *International Research Journal of Engineering and Technology (IRJET)* 7 (5), May 2020, pp. 6178-6183.

* cited by examiner

*Primary Examiner* — Kyle J Moody
(74) *Attorney, Agent, or Firm* — Seed Intellectual Property Law Group LLP

(57) ABSTRACT

A radiation tolerant gate driver for power converters with active-clamp reset and active-driven synchronous rectification uses integrated logic drivers for high efficiency and wide input range. A keep alive circuit prevents power train transistors from remaining on for extended durations after a transient or an undervoltage lockout (UVLO) event. Each of the integrated logic drivers includes two gate driver circuits, where one of the gate driver circuits uses the output of the other of the gate driver circuits as input per a logic table of the integrated logic driver, to ensure no shoot-through when the respective power train transistors are turned on and off.

20 Claims, 3 Drawing Sheets

RADIATION TOLERANT GATE DRIVE SCHEME FOR ACTIVE-CLAMP RESET FORWARD TOPOLOGY WITH ACTIVE-DRIVEN SYNCHRONOUS RECTIFICATION

BACKGROUND

Technical Field

The present application relates to pulse width modulation (PWM) controllers, and more particularly to PWM controllers that use a radiation tolerant gate drive scheme for an active-clamp reset forward topology with active-driven synchronous rectification.

Description of the Related Art

Integrated PWM controllers that can perform active-clamp reset may be used in order to achieve efficiency of 90% or greater. These PWM controllers typically require a companion controller on the output side to provide active-synchronous rectification. Also, these controllers are typically limited in operating frequency to no more than 500 kHz. In addition, these controllers are not radiation tolerant.

BRIEF SUMMARY

The present disclosure may be applied to integrated PWM controllers for printed circuit board (PCB) and hybrid direct-current (DC) to DC converters, for example. The present disclosure provides an improvement over conventional integrated PWM controllers. For example, the present disclosure enables integrated PWM controllers that perform active-clamp reset to operate beyond 500 kHz. Also, the present disclosure enables integrated PWM controllers that perform active-clamp reset to be radiation tolerant.

A radiation tolerant gate driver for power converters with active-clamp reset and active-driven synchronous rectification according to the present disclosure uses integrated logic drivers for high efficiency and a wide input range. Each integrated logic driver includes two gate driver circuits, and each of the gate driver circuits uses the output of the other of the gate driver circuits as an input per a logic table of the integrated logic driver to ensure no shoot-through when the respective switches are turned on and off. Keep alive circuitry according to the present disclosure prevents the power train switches from remaining on for extended durations after a transient or undervoltage-lockout (UVLO) event. The keep alive circuitry can be used to command a tristate condition to the power train of a DC to DC converter.

A gate driver device that outputs a plurality of drive signals based on a signal that is input to the gate driver device according to the present disclosure may be characterized as including: a first gate driver circuit including an input terminal, an enable terminal, and an output terminal, where a voltage level at the output terminal of the first gate driver circuit depends on a voltage level at the input terminal of the first gate driver circuit and a voltage level at the enable terminal of the first gate driver circuit; a second gate driver circuit including an input terminal, an enable terminal, and an output terminal, where a voltage level at the output terminal of the second gate driver circuit depends on a voltage level at the input terminal of the second gate driver circuit and a voltage level at the enable terminal of the second gate driver circuit, where the output terminal of the second gate driver circuit is electrically coupled to a first node that outputs a first drive signal, where the output terminal of the second gate driver circuit is electrically coupled to a second node that outputs a second drive signal, where the output terminal of the first gate driver circuit is electrically coupled to the input terminal of the second gate driver circuit, where the output terminal of the second gate driver circuit is electrically coupled to the input terminal of the first gate driver circuit, and where the enable terminal of the first gate driver circuit is electrically coupled to the signal that is input to the gate driver device; and a third gate driver circuit including an input terminal, an enable terminal, and an output terminal, where a voltage level at the output terminal of the third gate driver circuit depends on a voltage level at the input terminal of the third gate driver circuit and a voltage level at the enable terminal of the third gate driver circuit; a fourth gate driver circuit including an input terminal, an enable terminal, and an output terminal, where a voltage level at the output terminal of the fourth gate driver circuit depends on a voltage level at the input terminal of the fourth gate driver circuit and a voltage level at the enable terminal of the fourth gate driver circuit, where the output terminal of the third gate driver circuit is electrically coupled to a third node that outputs a third drive signal, where the output terminal of the fourth gate driver circuit is electrically coupled to a fourth node that outputs a fourth drive signal, where the output terminal of the third gate driver circuit is electrically coupled to the input terminal of the fourth gate driver circuit, where the output terminal of the fourth gate driver circuit is electrically coupled to the input terminal of the third gate driver circuit, and where the enable terminal of the third gate driver circuit is electrically coupled to the signal that is input to the gate driver device.

The first gate driver circuit, in operation, may cause the output terminal of the first gate driver circuit to have a first voltage level or a second voltage level that is greater than the first voltage level, the first gate driver circuit may cause the output terminal of the first gate driver circuit to have the first voltage level unless the enable terminal of the first gate driver circuit has the second voltage level and the input terminal of the first gate driver circuit simultaneously has the first voltage level, the second gate driver circuit, in operation, may cause the output terminal of the second gate driver circuit to have the first voltage level or the second voltage level, the second gate driver circuit may cause the output terminal of the second gate driver circuit to have the first voltage level unless the enable terminal of the second gate driver circuit has the second voltage level and the input terminal of the second gate driver circuit simultaneously has the first voltage level, the third gate driver circuit, in operation, may cause the output terminal of the third gate driver circuit to have the first voltage level or the second voltage level, the third gate driver circuit may cause the output terminal of the third gate driver circuit to have the first voltage level unless the enable terminal of the third gate driver circuit has the second voltage level and the input terminal of the third gate driver circuit simultaneously has the first voltage level, and the fourth gate driver circuit, in operation, may cause the output terminal of the fourth gate driver circuit to have the first voltage level or the second voltage level, the fourth gate driver circuit may cause the output terminal of the fourth gate driver circuit to have the first voltage level unless the enable terminal of the fourth gate driver circuit has the second voltage level and the input terminal of the fourth gate driver circuit simultaneously has the first voltage level.

The gate driver device may further include: a first keep alive circuit including a first diode, a first capacitor, and a first resistor, where a first terminal of the first diode is electrically coupled to the output terminal of the first gate driver circuit, and a second terminal of the first diode is electrically coupled to the enable terminal of the second gate driver circuit, where a first terminal of the first capacitor is electrically coupled to the enable terminal of the second gate driver circuit, and a second terminal of the first capacitor is electrically coupled to a ground terminal of the first gate driver circuit, and where a first terminal of the first resistor is electrically coupled to the enable terminal of the second gate driver circuit, and a second terminal of the first resistor is electrically coupled to the ground terminal of the first gate driver circuit. The gate driver device may further include: a second keep alive circuit including a second diode, a second capacitor, and a second resistor, where a first terminal of the second diode is electrically coupled to the output terminal of the third gate driver circuit, and a second terminal of the second diode is electrically coupled to the enable terminal of the third gate driver circuit, where a first terminal of the second capacitor is electrically coupled to the enable terminal of the fourth gate driver circuit, and a second terminal of the second capacitor is electrically coupled to a ground terminal of the fourth gate driver circuit, and where a first terminal of the second resistor is electrically coupled to the enable terminal of the fourth gate driver circuit, and a second terminal of the second resistor is electrically coupled to the ground terminal of the fourth gate driver circuit.

The gate driver device may further include: a first transformer including a primary coil that is electrically coupled to the signal that is input to the gate driver device and the enable terminal of the first gate driver circuit, and a secondary coil that is electrically coupled to the enable terminal of the third gate driver circuit; and a second transformer including a primary coil that is electrically coupled to the output terminal of the second gate driver circuit, and a secondary coil that is electrically coupled to the second node that outputs the second drive signal.

The gate driver device may further include: a forward converter powertrain including a transformer, a main transistor, an active reset transistor, a forward synchronous transistor, and a catch synchronous transistor, where the transformer includes a primary coil and a secondary coil, where a drain terminal of the main transistor is electrically coupled to a first terminal of the primary coil of the transformer, a source terminal of the main transistor is electrically coupled to a reference potential, and a gate terminal of the main transistor v electrically coupled to the first node that outputs the first drive signal, where a drain terminal of the active reset transistor is electrically coupled to a second terminal of the primary coil of the transformer, a source terminal of the active reset transistor is electrically coupled to the first terminal of the primary coil of the transformer, and a gate terminal of the active reset transistor is electrically coupled to the second node that outputs the second drive signal, where a drain terminal of the forward synchronous transistor is electrically coupled to a first terminal of the secondary coil of the transformer, and a gate terminal of the forward synchronous transistor is electrically coupled to the third node that outputs the third drive signal, and where a drain terminal of the catch synchronous transistor is electrically coupled to a second terminal of the secondary coil of the transformer, a source terminal of the catch synchronous transistor is electrically coupled to a source terminal of the forward synchronous transistor, and a gate terminal of the catch synchronous transistor is electrically coupled to the fourth node that outputs the fourth drive signal. Each of the main transistor, the active reset transistor, the forward synchronous transistor, and the catch synchronous transistor may be a same type of transistor.

The first gate driver circuit and the second gate driver circuit may be included in a first integrated logic driver that is provided in a first integrated circuit chip, and the third gate driver circuit and the fourth gate driver circuit may be included in a second integrated logic driver that is provided in a second integrated circuit chip.

A gate driver device that outputs a plurality of drive signals based on a signal that is input to the gate driver device according to the present disclosure may be characterized as including: a first gate driver circuit including an input terminal, an enable terminal, and an output terminal, where a voltage level at the output terminal of the first gate driver circuit depends on a voltage level at the input terminal of the first gate driver circuit and a voltage level at the enable terminal of the first gate driver circuit, and where the output terminal of the first gate driver circuit is electrically coupled to a first node that outputs a first drive signal; a second gate driver circuit including an input terminal, an enable terminal, and an output terminal, where a voltage level at the output terminal of the second gate driver circuit depends on a voltage level at the input terminal of the second gate driver circuit and a voltage level at the enable terminal of the second gate driver circuit, and where the output terminal of the second gate driver circuit is electrically coupled to a second node that outputs a second drive signal; a third gate driver circuit including an input terminal, an enable terminal, and an output terminal, where a voltage level at the output terminal of the third gate driver circuit depends on a voltage level at the input terminal of the third gate driver circuit and a voltage level at the enable terminal of the third gate driver circuit, and where the output terminal of the third gate driver circuit is electrically coupled to a third node that outputs a third drive signal; a fourth gate driver circuit including an input terminal, an enable terminal, and an output terminal, where a voltage level at the output terminal of the fourth gate driver circuit depends on a voltage level at the input terminal of the fourth gate driver circuit and a voltage level at the enable terminal of the fourth gate driver circuit, and where the output terminal of the fourth gate driver circuit is electrically coupled to a fourth node that outputs a fourth drive signal; a first keep alive circuit including a first diode, a first capacitor, and a first resistor, where a first terminal of the first diode is electrically coupled to the output terminal of the first gate driver circuit, and a second terminal of the first diode is electrically coupled to the enable terminal of the second gate driver circuit, where a first terminal of the first capacitor is electrically coupled to the enable terminal of the second gate driver circuit, and a second terminal of the first capacitor is electrically coupled to a ground terminal of the second gate driver circuit, and where a first terminal of the first resistor is electrically coupled to the enable terminal of the second gate driver circuit, and a second terminal of the first resistor is electrically coupled to the ground terminal of the second gate driver circuit; and a second keep alive circuit including a second diode, a second capacitor, and a second resistor, where a first terminal of the second diode is electrically coupled to the output terminal of the third gate driver circuit, and a second terminal of the second diode is electrically coupled to the enable terminal of the fourth gate driver circuit, where a first terminal of the second capacitor is electrically coupled to the enable terminal of the fourth gate driver circuit, and a second terminal of the second capacitor is electrically coupled to a ground terminal of the fourth gate driver circuit, and where a first terminal of the second resistor is electrically coupled to the enable terminal of the fourth gate driver circuit, and a second terminal of the second resistor is electrically coupled to the ground terminal of the fourth gate driver circuit.

The output terminal of the first gate driver circuit may be electrically coupled to the input terminal of the second gate driver circuit, the output terminal of the second gate driver circuit may be electrically coupled to the input terminal of the first gate driver circuit, the output terminal of the third gate driver circuit may be electrically coupled to the input terminal of the fourth gate driver circuit, and the output terminal of the fourth gate driver circuit may be electrically coupled to the input terminal of the third gate driver circuit.

The gate driver device may further include: a first transformer including a primary coil that is electrically coupled to the signal that is input to the gate driver device and the enable terminal of the first gate driver circuit, and a secondary coil that is electrically coupled to the enable terminal of the third gate driver circuit; and a second transformer including a primary coil that is electrically coupled to the output terminal of the second gate driver circuit, and a secondary coil that is electrically coupled to the second node that outputs the second drive signal.

The gate driver device may further include: a forward converter powertrain including a transformer, a main transistor, an active reset transistor, a forward synchronous transistor, and a catch synchronous transistor, where the transformer includes a primary coil and a secondary coil, where a drain terminal of the main transistor is electrically coupled to a first terminal of the primary coil of the transformer, a source terminal of the main transistor is electrically coupled to a reference potential, and a gate terminal of the main transistor is electrically coupled to the first node that outputs the first drive signal, where a drain terminal of the active reset transistor is electrically coupled to a second terminal of the primary coil of the transformer, a source terminal of the active reset transistor is electrically coupled to the first terminal of the primary coil of the transformer, and a gate terminal of the active reset transistor is electrically coupled to the second node that outputs the second drive signal, where a drain terminal of the forward synchronous transistor is electrically coupled to a first terminal of the secondary coil of the transformer, and a gate terminal of the forward synchronous transistor is electrically coupled to the third node that outputs the third drive signal, and where a drain terminal of the catch synchronous transistor is electrically coupled to a second terminal of the secondary coil of the transformer, a source terminal of the catch synchronous transistor is electrically coupled to a source terminal of the forward synchronous transistor, and a gate terminal of the catch synchronous transistor is electrically coupled to the fourth node that outputs the fourth drive signal. Each of the main transistor, the active reset transistor, the forward synchronous transistor, and the catch synchronous transistor may be a same type of transistor.

A method of operating a gate driver device according to the present disclosure may be characterized as including: providing an input signal to a first gate driver circuit including an input terminal, an enable terminal, and an output terminal, where the input signal is provided to the enable terminal of the first gate driver circuit, where a voltage level at the output terminal of the first gate driver circuit depends on a voltage level at the input terminal of the first gate driver circuit and a voltage level at the enable terminal of the first gate driver circuit, where the output terminal of the first gate driver circuit is electrically coupled to a second gate driver circuit including an input terminal, an enable terminal, and an output terminal, where the output terminal of the first gate driver circuit is electrically coupled to the enable terminal of the second gate driver circuit, where a voltage level at the output terminal of the second gate driver circuit depends on a voltage level at the input terminal of the second gate driver circuit and a voltage level at the enable terminal of the second gate driver circuit, where the output terminal of the second gate driver circuit is electrically coupled to the input terminal of the first gate driver circuit, where the output terminal of the first gate driver circuit is electrically coupled to a first node, and where the output terminal of the second gate driver circuit is electrically coupled to a second node; outputting a first drive signal from the first node; outputting a second drive signal from the second node; providing the input signal to a third gate driver circuit including an input terminal, an enable terminal, and an output terminal, where the input signal is provided to the enable terminal of the third gate driver circuit, where a voltage level at the output terminal of the third gate driver circuit depends on a voltage level at the input terminal of the third gate driver circuit and a voltage level at the enable terminal of the third gate driver circuit, where the output terminal of the third gate driver circuit is electrically coupled to a fourth gate driver circuit including an input terminal, an enable terminal, and an output terminal, where the output terminal of the third gate driver circuit is electrically coupled to the input terminal of the fourth gate driver circuit, where a voltage level at the output terminal of the fourth gate driver circuit depends on a voltage level at the input terminal of the fourth gate driver circuit and a voltage level at the enable terminal of the fourth gate driver circuit, where the output terminal of the fourth gate driver circuit is electrically coupled to the input terminal of the third gate driver circuit, where the output terminal of the third gate driver circuit is electrically coupled a third node, and where the output terminal of the fourth gate driver circuit is electrically coupled to a fourth node; outputting a third drive signal from the third node; and outputting a fourth drive signal from the fourth node.

The may further include: causing the output terminal of the first gate driver circuit to have a first voltage level or a second voltage level that is greater than the first voltage level, including causing the output terminal of the first gate driver circuit to have the first voltage level unless the enable terminal of the first gate driver circuit has the second voltage level and the input terminal of the first gate driver circuit simultaneously has the first voltage level; causing the output terminal of the second gate driver circuit to have the first voltage level or the second voltage level, including causing the output terminal of the second gate driver circuit to have the first voltage level unless the enable terminal of the second gate driver circuit has the second voltage level and the input terminal of the second gate driver circuit simultaneously has the first voltage level; causing the output terminal of the third gate driver circuit to have the first voltage level or the second voltage level, including causing the output terminal of the third gate driver circuit to have the first voltage level unless the enable terminal of the third gate driver circuit has the second voltage level and the input terminal of the third gate driver circuit simultaneously has the first voltage level; and causing the output terminal of the fourth gate driver circuit to have the first voltage level or the second voltage level, including causing the output terminal of the fourth gate driver circuit to have the first voltage level unless the enable terminal of the fourth gate driver circuit has the second voltage level and the input terminal of the fourth gate driver circuit simultaneously has the first voltage level.

The first drive signal may have a first voltage level while the second drive signal has a second voltage level different from the first voltage level. The first drive signal may have the second voltage level while the second drive signal has the first voltage level. The third drive signal may have the first voltage level while the fourth drive signal has the second voltage level. The third drive signal may have the second voltage level while the fourth drive signal has the first voltage level. The first drive signal may have a first voltage level while the second drive signal has a second voltage level different from the first voltage level, the first drive signal may have the second voltage level while the second drive signal has the first voltage level, the third drive signal may have the first voltage level while the fourth drive signal has the second voltage level, and the third drive signal may have the second voltage level while the fourth drive signal has the first voltage level.

DETAILED DESCRIPTION

Figure 1:
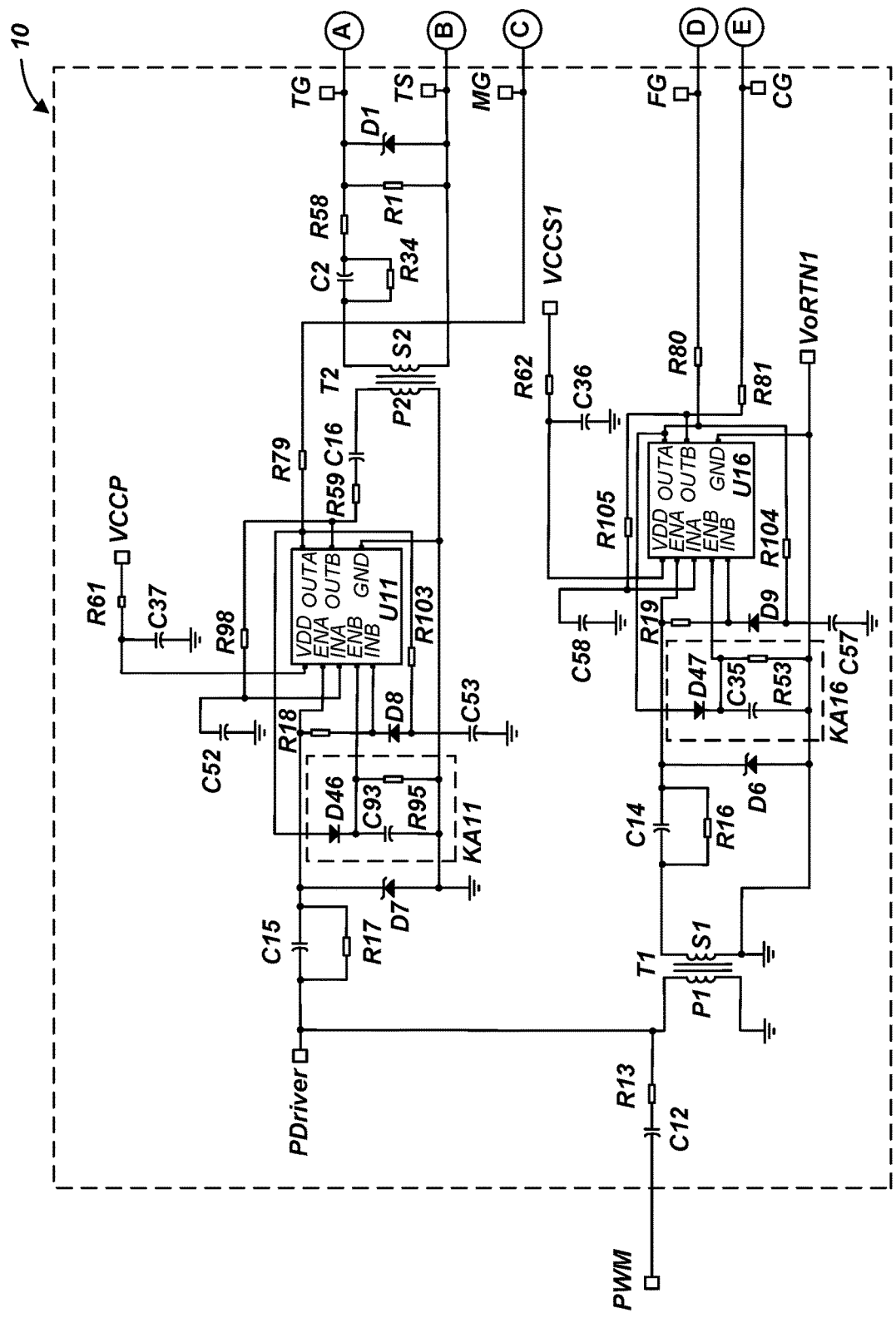
FIG. 1 shows a circuit diagram of a radiation tolerant gate driver, according to one or more embodiments of the present disclosure.

FIG. 1 shows a circuit diagram of a radiation tolerant gate driver circuit or device 10 ("gate driver") according to one or more embodiments of the present disclosure. The radiation tolerant gate driver may be used to drive a forward converter powertrain 20 shown in FIG. 2, in order to provide a DC to DC power converter.

Figure 2:
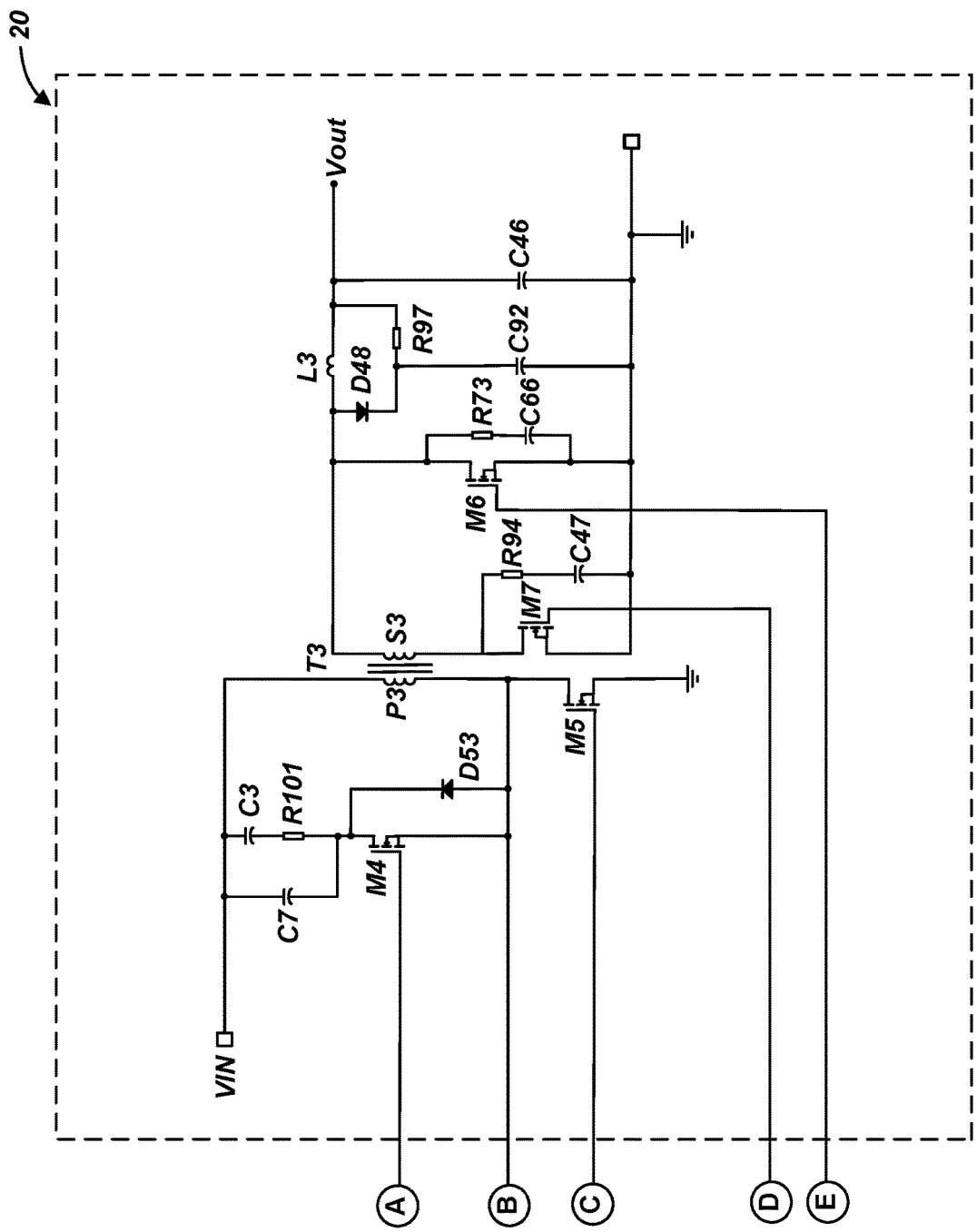
FIG. 2 shows a circuit diagram of a forward converter powertrain of a direct current (DC) to DC power converter, according to one or more embodiments of the present disclosure.

The forward converter powertrain 20 performs active-clamp reset and synchronous rectification. As shown in FIG. 2, a voltage VIN is electrically coupled to a first terminal of a capacitor C7, a first terminal of a capacitor C3, and a first terminal of a primary coil P3 of a transformer T3. A second terminal of the capacitor C3 is electrically coupled to a first terminal of a resistor R101, which has a second terminal that is electrically coupled to a second terminal of the capacitor C7, a drain terminal of a transistor M4, and a cathode terminal of a diode D53. A source terminal of the transistor M4 is electrically coupled to an anode terminal of the diode D53, a second terminal of the primary coil P3 of the transformer T3, and a drain terminal of a transistor M5, which has a source terminal that is electrically coupled to a ground terminal that is electrically coupled to a reference potential.

The transformer T3 also includes a secondary coil S3 having a first terminal that is electrically coupled to a drain terminal of a transistor M6, a first terminal of a resistor R73, an anode terminal of a diode D48, and a first terminal of an inductor L3. A second terminal of the inductor L3 is electrically coupled to a first terminal of a resistor R97, and a first terminal of a capacitor C46. A second terminal of the capacitor C46 is electrically coupled to a first terminal of a capacitor C92, a first terminal of a capacitor C66, a source terminal of the transistor M6, a first terminal of a capacitor C47, and a source terminal of a transistor M7. It is noted that the ground terminal on the secondary side of the transformer T3 is not necessarily the same reference potential as the ground terminal on the primary side of the transformer T3. An output voltage Vout is output from the forward converter powertrain 20 to a load. A second terminal of the capacitor C92 is electrically coupled to a second terminal of the resistor R97 and a cathode terminal of the diode D48. A second terminal of the capacitor C66 is electrically coupled to a second terminal of the resistor R73. A second terminal of the capacitor C47 is electrically coupled to a first terminal of a resistor R94, which has a second terminal that is electrically coupled to a drain terminal of the transistor M7 and a second terminal of the secondary coil S3 of the transformer T3.

The transistor M5 functions as a main power switch of the forward converter powertrain 20. The transistor M5 causes a forward transfer of power to the secondary coil S3 of the transformer T3 when the transistor M5 is on and conducting. The transistor M4 functions as an active reset switch of the forward converter powertrain 20. The transistor M4 resets a core of the transformer T3 to prevent saturation (i.e., discharge a magnetizing current of the transformer T3 during the off period of the transistor M5). When the transistor M4 is turned off, the transistor M5 is turned on, and vice versa. Magnetizing energy in the transformer T3 is transferred to the capacitors C3 and C7, which act as clamping capacitors that resonate with a magnetizing inductance to maintain a necessary level of reset voltage. This active clamp reset provides a non-dissipative reset of the transformer T3 and minimal voltage stress on the transistor M5 under steady state conditions as dead time is almost zero.

The transistors M6 and M7 are used to perform synchronous rectification in the forward converter powertrain 20. The transistors M6 and M7 are biased to conduct when a diode would have been conducting from anode to cathode, and conversely, are gated to block current when a diode would have been blocking from cathode to anode. The transistor M6 functions as a catch switch of the forward converter powertrain 20. The transistor M6 is turned on and is conductive while the transistor M5 is turned off and is non-conductive. The transistors M7 functions as a forward synchronous switch of the forward converter powertrain 20. The transistor M7 is turned on and is conductive while the transistor M5 is turned on and is conductive. In one or more embodiments, the radiation tolerant gate driver 10 and the forward converter powertrain 20 function in a manner that is similar to the active-clamp forward converter with automatic enhanced self-driven synchronous rectification shown in FIG. 5 of U.S. Pat. No. 9,293,999, which is incorporated by reference in its entirety herein.

Referring once again to FIG. 1, a pulse-width modulated (PWM) input signal PWM is provided to an input terminal of the radiation tolerant gate driver 10. As described below, the radiation tolerant gate driver 10 uses the input signal PWM to generate four gate drive signals that are provided as control signals to the respective gate terminals of the transistors M4-M7 of the forward converter powertrain 20 shown in FIG. 2.

More particularly, the input terminal PWM of the radiation tolerant gate driver 10 is electrically coupled to a first terminal of a capacitor C12, which has a second terminal that is electrically coupled to a first terminal of a resistor R13. A second terminal of the resistor R13 is electrically coupled to a first terminal of a capacitor C15, a first terminal of resistor R17, and a first terminal of a primary coil P1 of a transformer T1. A second terminal of the primary coil P1 of the transformer T1 is electrically coupled to a ground terminal that is electrically coupled to a reference potential. The transformer T1 also includes a secondary coil S1 having a first terminal that is electrically coupled to a first terminal of a capacitor C14 and a first terminal of a resistor R16. A second terminal of the secondary coil S1 of the transformer T1 is electrically coupled to an anode terminal of a Zener diode D6, a first terminal of a capacitor C35, a first terminal of a resistor R53, and a ground terminal GND of an integrated logic gate driver U16. A second terminal of the capacitor C35 is electrically coupled to a cathode terminal of a diode D47, a second terminal of the resistor R53, and a second enable terminal of the integrated logic gate driver U16. An anode terminal of the diode D47 is electrically coupled to a first output terminal OUTA of the integrated logic gate driver U16.

The integrated logic gate driver U16 includes two gate driver circuits. One of the gate driver circuits of the integrated logic gate driver U16 is used to generate a catch synchronous switch drive signal that is output from a node CG, which is electrically coupled to a gate terminal of the transistor M6 that functions as the catch synchronous switch of the forward converter powertrain 20 shown in FIG. 2. The other of the gate driver circuits of the integrated logic gate driver U16 is used to generate a forward synchronous switch drive signal that is output from a node FG, which is electrically coupled to a gate terminal of the transistor M7 that functions as the forward synchronous switch of the forward converter powertrain 20 shown in FIG. 2.

A cathode terminal of the Zener diode D6 is electrically coupled to a second terminal of the capacitor C14, a second terminal of the resistor R16, a first terminal of a resistor R19, and a first enable terminal ENA of the integrated logic gate driver U16. A second terminal of the resistor R19 is electrically coupled to a cathode terminal of a diode D9 and a second input terminal INB of the integrated logic gate driver U16. An anode terminal of the diode D9 is electrically coupled to a first terminal of a capacitor C57 and a first terminal of a resistor 104, which has a second terminal that is electrically coupled to a first output terminal OUTA of the integrated logic gate driver U16 and a first terminal of a resistor R80. A second terminal of the capacitor C57 is electrically coupled to a ground terminal that is electrically coupled to a reference potential. A second terminal of the resistor R80 is electrically coupled to the node FG, which is electrically coupled to a gate terminal of the transistor M7 that functions as the forward synchronous switch of the forward converter powertrain 20 shown in FIG. 2.

A power supply terminal VDD of the integrated logic gate driver U16 is electrically coupled to a first terminal of a capacitor C36 and to a first terminal of a resistor R62. A second terminal of the capacitor C36 is electrically coupled to a ground terminal that is electrically coupled to a reference potential. A first terminal of a capacitor C58 is electrically coupled to a ground terminal that is electrically coupled to a reference potential, and a second terminal of the of the capacitor C58 is electrically coupled to a first input terminal INA of the integrated logic gate driver U16 and a first terminal of a resistor R105. A second terminal of the resistor 105 is electrically coupled to a second output terminal OUTB of the integrated logic gate driver U16 and a first terminal of a resistor R81. A second terminal of the resistor R81 is electrically coupled to the node CG, which is electrically coupled to a gate terminal of the transistor M6 that functions as the catch switch of the forward converter powertrain 20 shown in FIG. 2.

Referring now to the upper portion of FIG. 1, the radiation tolerant gate driver 10 includes an integrated logic gate driver U11 that includes two gate driver circuits. One of the gate driver circuits of the integrated logic gate driver U11 is used to generate a main power switch drive signal that is output from a node MG, which is electrically coupled to a gate terminal of the transistor M5 (shown in FIG. 2) that functions as the main power switch of the forward converter powertrain 20. The other of the gate driver circuits of the integrated logic gate driver U11 is used to generate an active-clamp reset switch drive signal that is output from a node TG, which is electrically coupled to a gate terminal of the transistor M4 (shown in FIG. 2) that functions as the active-clamp reset switch of the forward converter powertrain 20.

As mentioned above, the first terminal of the primary coil P1 of the transformer T1 is electrically coupled to the first terminal of resistor R17 and the first terminal of the capacitor C15. A second terminal of the capacitor C15 is electrically coupled to a second terminal of resistor R17, a cathode terminal of a Zener diode D7, a first terminal of a resistor R18, and a first enable terminal ENA of the integrated logic gate driver U11. An anode terminal of the Zener diode D7 is electrically coupled to a ground terminal that is electrically coupled to a reference potential, a first terminal of a capacitor C93, a first terminal of a resistor R95, a ground terminal GND of the integrated logic gate driver U11, and a first terminal of a primary coil P2 of a transformer T2. A second terminal of the capacitor C93 is electrically coupled to a second terminal of the resistor R95, a second enable terminal ENB of the integrated logic gate driver U11, and a cathode terminal of a diode D46. An anode terminal of the diode D46 is electrically coupled to a first output terminal OUTA of the integrated logic gate driver U11 and a first terminal of a resistor R79.

A second terminal of the resistor R79 is electrically coupled to the node MG, which is electrically coupled to the gate terminal of the transistor M5 that functions as the main power switch of the forward converter powertrain 20. A second terminal of the resistor R18 is electrically coupled to a cathode terminal of a diode D8 and a second input terminal INB of the integrated logic gate driver U11. An anode terminal of the diode D8 is electrically coupled to a first terminal of a capacitor C53 and a first terminal of a resistor R103, which has a second terminal that is electrically coupled to the first output terminal OUTA of the integrated logic gate driver U11. A second terminal of the capacitor C53 is electrically coupled to a ground terminal that is electrically coupled to a reference potential.

A second terminal of the primary coil P2 of the transformer T2 is electrically coupled a first terminal of a capacitor C16, which has a second terminal that is electrically coupled to a first terminal of a resistor R59. A second terminal of the resistor R59 is electrically coupled to a second output terminal OUTB of the integrated logic gate driver U11 and a first terminal of a resistor R98. A second terminal of the resistor R98 is electrically coupled to a first terminal of a capacitor C52 and a first input terminal INA of the integrated logic gate driver U11. A second terminal of the capacitor C52 is electrically coupled to a ground terminal that is electrically coupled to a reference potential. A power supply terminal VDD of the integrated logic gate driver U11 is electrically coupled to a first terminal of a capacitor C37 and to a first terminal of a resistor R61. A second terminal of the capacitor C37 is electrically coupled to a ground terminal that is electrically coupled to a reference potential.

The transformer T2 also includes a secondary coil S2 having a first terminal that is electrically coupled to a first terminal of a capacitor C2 and a first terminal of a resistor R34. A second terminal of the capacitor C2 is electrically coupled to a second terminal of the resistor R34 and a first terminal of a resistor R58. A second terminal of the resistor R58 is electrically coupled to a first terminal of a resistor R1, a cathode terminal of a Zener diode D1, and to the node TG that is electrically coupled to the gate terminal of the transistor M4 (shown in FIG. 2) that functions as the active-clamp reset switch of the forward converter powertrain 20. A second terminal of the secondary coil S2 of the transformer T2 is electrically coupled to a second terminal of the resistor R1, an anode terminal of the Zener diode D1, and a node TS, which is electrically coupled to the source terminal of the transistor M4, the anode terminal of the diode D53, the drain terminal of the transistor M5, and the second terminal of the primary coil P3 of the transformer T3 of the forward converter powertrain 20 shown in FIG. 2.

In one or more implementations, each of the integrated logic gate drivers U11 and U16 is an integrated logic driver that is provided in an integrated circuit chip, although implementations of the present disclosure are not so limited. For example, each of the integrated logic gate drivers U11 and U16 may be a model 2EDN7523 integrated logic gate driver from Infineon Technologies, with inverting input logic and output inverting logic. In one or more implementations, the transistors M4-M7 are symmetrical in circuitry to ensure a similar propagation delay in each of the transistors M4-M7. For example, each of the transistors M4-M7 is a same type of transistor, such as an N-Channel, Gallium Nitride (GaN) Power Transistor EPC2024 from Efficient Power Conversion Corporation (EPC).

As discussed above, each of the integrated logic gate drivers U11 and U16 includes a first input terminal INA, a first enable terminal ENA, a second input terminal INB, a second enable terminal ENB, a first output terminal OUTA, a second output terminal OUTB, a power supply input terminal VDD and a ground terminal GND. Also, each of the integrated logic gate drivers U11 and U16 includes two gate driver circuits, namely, a first gate driver circuit including the first input terminal INA, the first enable terminal ENA, and the first output terminal OUTA, and a second gate driver circuit including the second input terminal INB, the second enable terminal ENB, and the second output terminal OUTB, wherein the power supply input terminal VDD and the ground terminal GND are shared by the first and second gate driver circuits. A voltage level at the first output terminal OUTA depends on a voltage level at the first input terminal INA and a voltage level at the first enable terminal ENA. Similarly, a voltage level at the second output terminal OUTB depends on a voltage level at the second input terminal INB and a voltage level at the second enable terminal OUTB.

TABLE 1

| Input Terminals | | | | | Output Terminals | |
|---|---|---|---|---|---|---|
| ENA | ENB | INA | INB | UVLO | OUTA | OUTB |
| x | x | x | x | active | L | L |
| L | L | x | x | inactive | L | L |
| H | L | L | x | inactive | H | L |
| H | L | H | x | inactive | L | L |
| L | H | x | L | inactive | L | H |
| L | H | x | H | inactive | L | L |
| H | H | L | L | inactive | H | H |
| H | H | H | L | inactive | L | H |
| H | H | L | H | inactive | H | L |
| H | H | H | H | inactive | L | L |

More particularly, the integrated logic gate drivers U11 and U16 operate according to a logic table that is shown in Table 1. A value of "L" indicates a low logic level, a value of "H" indicates a high logic level, and a value of "x" indicates any logic level. The low logic level L is less than the high logic level H. For example, the low logic level L is between zero and two volts, and the high logic level H is between three and five volts. The integrated logic gate drivers U11 and U16 have an undervoltage lockout (UVLO) function which ensures that the output can be switched to the high level H only if the supply voltage exceeds the UVLO threshold voltage. A low logic level L at an enable input terminal (i.e., ENA, ENB), or an undervoltage lockout (UVLO) event, due to low voltage at the power supply input terminal VDD, causes the respective output of the integrated logic gate drivers U11 and U16 to also have the low logic level L, regardless of the input signal. A value of "inactive" means that the supply voltage is above the UVLO threshold voltage, and a value of "active" means that UVLO disable is active.

As can be seen from Table 1, each of the integrated logic gate drivers U11 and U16 causes the first output terminal OUTA to have either the low logic level L (e.g., low voltage level) or the high logic level H (e.g., high voltage level). More particularly, each of the integrated logic gate drivers U11 and U16 causes the first output terminal OUTA to have the low logic level L unless the first enable terminal ENA has the high logic level H (e.g., high voltage level) and the first input terminal INA simultaneously has the low logic level L (e.g., low voltage level). Similarly, each of the integrated logic gate drivers U11 and U16 causes the second output terminal OUTB to have the low logic level L (e.g., low voltage level) or the high logic level H (e.g., high voltage level). More particularly, each of the integrated logic gate drivers U11 and U16 causes the second output terminal OUTB to have the low logic level L unless the second enable terminal ENB has the high logic level H (e.g., high voltage level) and the second input terminal INB simultaneously has the low logic level L (e.g., low voltage level).

Referring to FIGS. 1 and 2, the first output terminal OUTA of the integrated logic gate driver U11 is electrically coupled via the resistor R79 to the node MG that outputs the main power switch drive signal, which is electrically coupled to the gate terminal of the transistor M5 that functions as the main power switch of the forward converter powertrain 20. The second output terminal OUTB of the integrated logic gate driver U11 is electrically coupled via the transformer T2 to the node TG that outputs the active-clamp reset switch drive signal, which is electrically coupled to the gate terminal of the transistor M4 that functions as the active reset switch of the forward converter powertrain 20. The first enable terminal ENA of the integrated logic gate driver U11 is electrically coupled via the capacitor C15, the resistor R13, and the capacitor C12 to the input signal PWM that is input to the gate driver 10. The first output terminal OUTA of the integrated logic gate driver U11 is electrically coupled via the resistor R103 and the diode D8 to the second input terminal INB of the integrated logic gate driver U11. The second output terminal OUTB of the integrated logic gate driver U11 is electrically coupled via the resistor R98 to the first input terminal INA of the integrated logic gate driver U11.

Because each of the gate driver circuits of the integrated logic gate driver U11 uses the output of the other of the driver circuits per the logic table of the integrated logic gate driver U11, only one of the output terminals OUTA and OUTB of the integrated logic gate driver U11 has the high logic level H at any given time, which ensures that only one of the transistors M4 and M5 is turned on at any given time. For example, an input state of ENA=H, ENB=H, INA=L, INB=L (which results in an output state of OUTA=H and OUTB=H) cannot occur because OUTA and OUTB are coupled to INB and INA, respectively. Such a configuration ensures that that there is no so-called shoot-through caused by both of the transistors M4 and M5 being turned on simultaneously. That is, the transistors M4 and M5 do not effectively short-circuit the voltage VIN to the ground terminal that is electrically coupled to a reference potential, because only one of the transistors M4 and M5 is turned on at any given time.

In addition, the first output terminal OUTA of the integrated logic gate driver U16 is electrically coupled via the resistor R80 to the node FG that outputs the forward synchronous switch drive signal, which is electrically coupled to the gate terminal of the transistor M7 that functions as the forward synchronous switch of the forward converter powertrain 20. The second output terminal OUTB of the integrated logic gate driver U16 is electrically coupled via the resistor R81 to the node CG that outputs the catch synchronous switch drive signal, which is electrically coupled to the gate terminal of the transistor M6 that functions as the catch switch of the forward converter powertrain 20. The first enable terminal ENA of the integrated logic gate driver U16 is electrically coupled via the transformer T1 to the input signal PWM that is input to the gate driver 10. The first output terminal OUTA of the integrated logic gate driver U16 is electrically coupled via the resistor R104 and the diode D9 to the second input terminal INB of the integrated logic gate driver U16. The second output terminal OUTB of the integrated logic gate driver U1 is electrically coupled via the resistor R105 to the first input terminal INA of the integrated logic gate driver U1.

Because each of the gate driver circuits of the integrated logic gate driver U16 uses the output of the other of the driver circuits per the logic table of the integrated logic gate driver U16, only one of the output terminals OUTA and OUTB of the integrated logic gate driver U16 has the high logic level H at any given time, which ensures that only one of the transistors M6 and M7 is turned on at any given time. Such a configuration ensures that that there is no so-called shoot-through caused by both of the transistors M6 and M7 being turned on simultaneously. That is, the transistors M6 and M7 do not effectively short-circuit both terminals of the secondary coil S3 of the transformer T3 to the ground terminal that is electrically coupled to a reference potential, because only one of the transistors M6 and M7 is turned on at any given time.

Referring once again to FIG. 1, the radiation tolerant gate driver 10 includes a keep alive circuit KA11 for the integrated logic gate driver U11 to limit the last maximum on-time of the transistor M4 that functions as the active reset switch of the forward converter powertrain 20. That is, the keep alive circuit KA11 for the integrated logic gate driver U11 limits the maximum on-time of the transistor M4 that functions as the active reset switch of the forward converter powertrain 20 when an event occurs in which the input signal PWM goes low and stops switching, for example, a UVLO event. Also, the radiation tolerant gate driver 10 includes a keep alive circuit KA16 for the integrated logic gate driver U16 to limit the last maximum on-time of the transistor M6 that functions as the catch switch of the forward converter powertrain 20. That is, the keep alive circuit KA16 for the integrated logic gate driver U16 limits the maximum on-time of the transistor M6 that functions as the catch switch of the forward converter powertrain 20 when an event occurs in which the input signal PWM goes low and stops switching, for example, a UVLO event. In one or more embodiments, the maximum on-time of the transistors M4 and M6 is set to a useful duration such as twice the switching period of the forward converter powertrain 20.

Without the keep alive circuit KA11 and the keep alive circuit KA16, the transistor M6 that functions as the catch switch of the forward converter powertrain 20 stays on for extended time when the transistor M5 that functions as the main power switch and the transistor M7 that functions as the forward synchronous switch of the forward converter powertrain 20 are turned off, which causes a large negative inductor current (e.g., in inductor L3 of the forward converter powertrain 20) and increased voltage stress on the transistor M6 that functions as the catch switch of the forward converter powertrain 20. There can also be increased voltage stress if the current becomes exceedingly negative, then the transistor M6 turns off. An example would be a UVLO condition where the transistor M6 is on for a very long time until the UVLO of the integrated logic gate driver U16 is tripped and the transistor M6 turns off. The very large negative current now causes the transistor M6's drain to rise and overstress the drain voltage of the transistor M6.

More particularly, the keep alive circuit KA11 includes the diode D46, the capacitor C93, and the resistor R95. The anode terminal of the diode D46 is electrically coupled to the first output terminal OUTA of the integrated logic gate driver U11, and the cathode terminal of the diode D46 is electrically coupled to the second enable terminal ENB of the integrated logic gate driver U11, the second terminal of the capacitor C93, and the second terminal of the resistor R95. The first terminal of the capacitor 93 is electrically coupled to the first terminal of the resistor R95 and the GND of the integrated logic gate driver U11.

As described above, the second output terminal OUTB of the integrated logic gate driver U11 has the high logic level H only while the second enable terminal ENB of the integrated logic gate driver U11 has the high logic level H and the second input terminal INB of the integrated logic gate driver U11 simultaneously has the low logic level L. The keep alive circuit KA11 sets the maximum amount of time that the second enable terminal ENB of the integrated logic gate driver U11 has the high logic level H, as the voltage at the first output terminal OUTA of the integrated logic gate driver U11 changes from the high logic level H to the low logic L. As the capacitor C95 discharges through the resistor R95, the voltage stored by the capacitor C95 decreases, which causes the voltage level at the second enable terminal ENB of the integrated logic gate driver U11 to decrease from the high logic level H to the low logic level L. Thus, the keep alive circuit KA11 sets the maximum amount of time that the second output terminal OUTB of the integrated logic gate driver U11 has the high logic level H.

The transistor M4 is turned on while the second output terminal OUTB of the integrated logic gate driver U11 has the high logic level H. Accordingly, the keep alive circuit KA11 sets the maximum amount of time that the transistor M5 is turned on.

Similarly, the keep alive circuit KA16 includes the diode D47, the capacitor C35, and the resistor R53. The anode terminal of the diode D47 is electrically coupled to the first output terminal OUTA of the integrated logic gate driver U16, and the cathode terminal of the diode D47 is electrically coupled to the second enable terminal ENB of the integrated logic gate driver U16, the second terminal of the capacitor C35, and the second terminal of the resistor R53. The first terminal of the capacitor C35 is electrically coupled to the first terminal of the resistor R53 and the ground terminal GND of the integrated logic gate driver U16.

As described above, the second output terminal OUTB of the integrated logic gate driver U16 has the high logic level H only while the second enable terminal ENB of the integrated logic gate driver U16 has the high logic level H and the second input terminal INB of the integrated logic gate driver U16 simultaneously has the low logic level L. The keep alive circuit KA16 sets the maximum amount of time that the second enable terminal ENB of the integrated logic gate driver U16 has the high logic level H, as the voltage at the first output terminal OUTA of the integrated logic gate driver U16 changes from the high logic level H to the low logic L. As the capacitor C35 discharges through the resistor R53, the voltage stored by the capacitor C35 decreases, which causes the voltage level at the second enable terminal ENB of the integrated logic gate driver U16 to decrease from the high logic level H to the low logic level L. Thus, the keep alive circuit KA16 sets the maximum amount of time that the second output terminal OUTB of the integrated logic gate driver U16 has the high logic level H. The transistor M6 is turned on while the second output terminal OUTB of the integrated logic gate driver U16 has the high logic level H. Accordingly, the keep alive circuit KA16 sets the maximum amount of time that the transistor M6 is turned on.

Figure 3A:
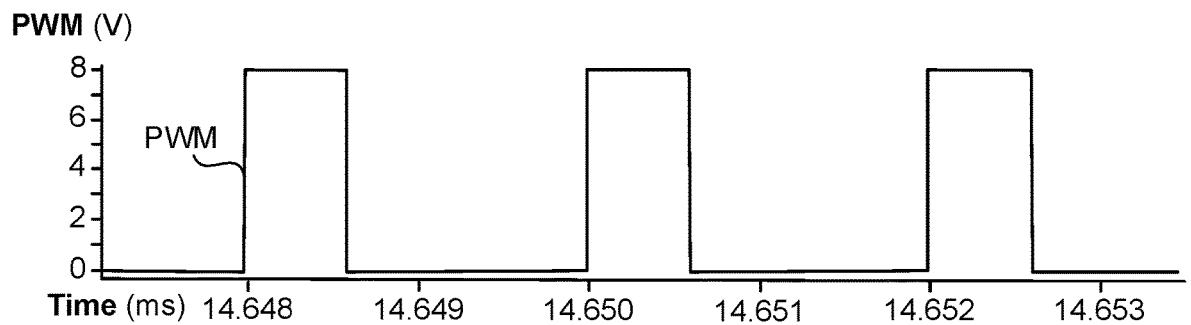
FIGS. 3A, 3B, 3C, and 3D show simulation plots of signals included in the radiation tolerant gate driver shown in FIG. 1, according to one or more embodiments of the present disclosure.
Figure 3B:
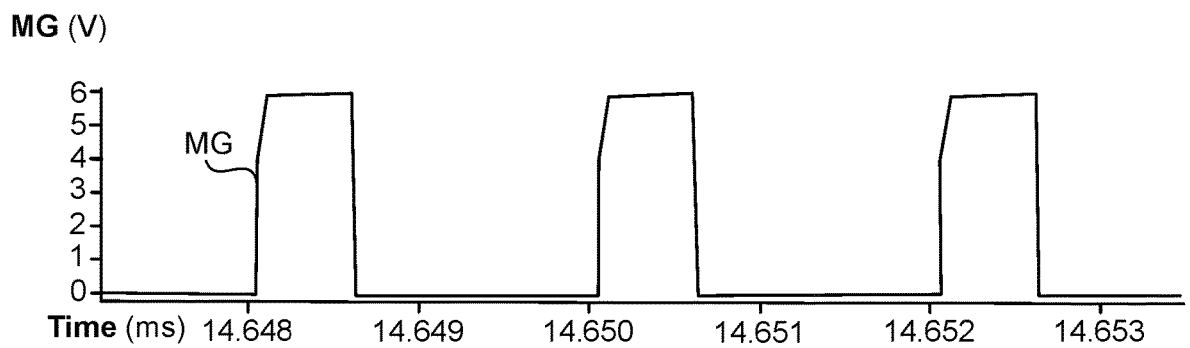

FIGS. 3A, 3B, 3C, and 3D show simulation plots of signals included in the radiation tolerant gate driver 10 shown in FIG. 1, according to one or more embodiments of the present disclosure. More particularly, FIG. 3A shows a simulation plot of a voltage level (in volts) of the input signal PWM that is input to the in the radiation tolerant gate driver 10 from the PWM controller that is external to the radiation tolerant gate driver 10. FIG. 3B shows a simulation plot of a voltage level (in volts) of the main power switch drive signal that is output from the node MG that is electrically coupled to the gate terminal of the transistor M5 that functions as the main power switch of the forward converter powertrain 20. The main power switch drive signal shown in FIG. 3B has the waveform that is similar to the waveform of the input signal PWM shown in FIG. 3A, except that the main power switch drive signal is slightly delayed and reduced in voltage level compared to the input signal PWM.

Figure 3C:
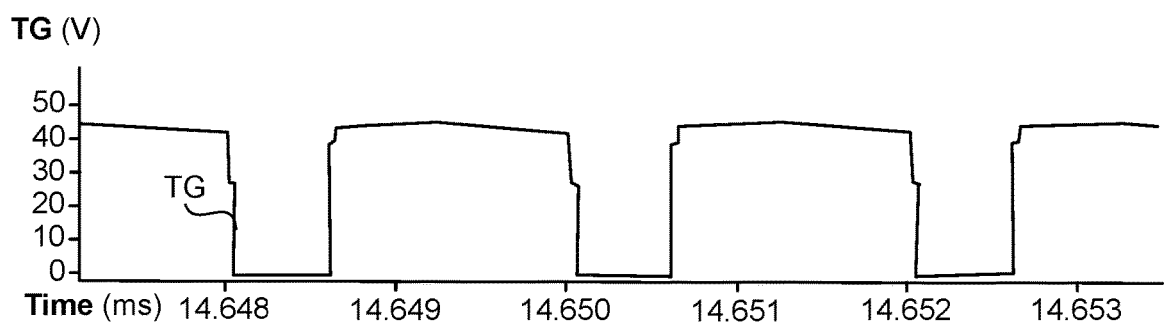

FIG. 3C shows a simulation plot of a voltage level (in volts) of the active-clamp reset switch drive signal that is output from the node TG that is electrically coupled to the gate terminal of the transistor M4 that functions as the active reset switch of the forward converter powertrain 20. Note that amplitude of TG(V) of FIG. 3C is modified by the voltage VIN shown in FIG. 2. The main power switch drive signal shown in FIG. 3B and the active-clamp reset switch drive signal shown in FIG. 3C are complementary signals to the extent that one has a non-zero voltage level while the other has a zero voltage level, and vice versa. Thus, a first one of the transistor M4 and M5 is turned on while a second one of the transistor M4 and M5 is turned off.

Figure 3D:
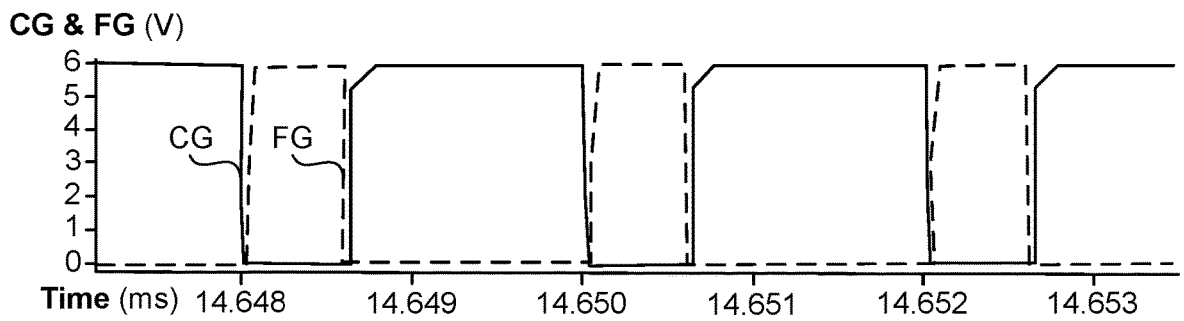

FIG. 3D shows a simulation plot of a voltage level (in volts) of the catch synchronous switch drive signal that is output from the node CG that is electrically coupled to the gate terminal of the transistor M6 that functions as the catch synchronous switch of the forward converter powertrain 20. Also, FIG. 3D shows a simulation plot of a voltage level (in volts) of the forward synchronous switch drive signal that is output from the node FG that is electrically coupled to the gate terminal of the transistor M7 that functions as the forward synchronous switch of the forward converter powertrain 20. The catch synchronous switch drive signal and the forward synchronous switch drive signal are complementary signals to the extent that one has a non-zero voltage level while the other has a zero voltage level, and vice versa. Thus, a first one of the transistor M6 and M7 is turned on while a second one of the transistor M7 and M8 is turned off.

In addition, the waveform of the main power switch drive signal shown in FIG. 3B is similar to the waveform of the forward synchronous switch drive signal shown in FIG. 3D. Accordingly, the transistor M5 that functions as the main power switch of the forward converter powertrain 20 and the transistor M6 that functions as the catch synchronous switch of the forward converter powertrain 20 turn on and off simultaneously. Also, the waveform of the active-clamp reset switch drive signal shown in FIG. 3C is similar to the waveform of the catch synchronous switch drive signal shown in FIG. 3D. Accordingly, the transistor M4 that functions as the active-clamp reset switch of the forward converter powertrain 20 and the transistor M7 that functions as the forward synchronous switch of the forward converter powertrain 20 turn on and off simultaneously.

Referring once again to FIGS. 1 and 2, the present disclosure solves several concurrent issues for high-performance, high-efficiency radiation hardened DC-DC power converters using discrete components. For example, the keep alive circuit KA11 sets a maximum amount of time that the active-clamp reset switch drive signal output from the node TG causes the transistor M4 to be on, and the keep alive circuit KA16 sets the maximum amount of time that catch synchronous switch drive signal output from the node CG causes the transistor M6 to be on, which prevents damage to the forward converter powertrain 20 in extreme transient events such as UVLO. Also, each of the integrated logic gate driver U11 and the integrated logic gate driver U16 uses the output of one driver as the input to the other per the driver's logic table to ensure that there is no shoot-through when the respective switch is on. For example, the transistor M5 that functions as the main power switch of the forward converter powertrain 20 must be off before turning on the transistor M4 that functions as the active reset switch of the forward converter powertrain 20 is turned on.

The present disclosure provides enhanced radiation tolerances by design due to component selection. More particularly, the transistors M4, M5, M6, M7 are implemented as GaN FETs, which are more radiation tolerant than MOSFETs. The present disclosure does not require a two-controller solution thereby reducing overall cost. In addition, the present disclosure has fewer components than other conventional designs.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A gate driver device that outputs a plurality of drive signals based on a signal that is input to the gate driver device, the gate driver device comprising:
  a first gate driver circuit including an input terminal, an enable terminal, and an output terminal,
  wherein a voltage level at the output terminal of the first gate driver circuit depends on a voltage level at the input terminal of the first gate driver circuit and a voltage level at the enable terminal of the first gate driver circuit;
  a second gate driver circuit including an input terminal, an enable terminal, and an output terminal,
  wherein a voltage level at the output terminal of the second gate driver circuit depends on a voltage level at the input terminal of the second gate driver circuit and a voltage level at the enable terminal of the second gate driver circuit,
  wherein the output terminal of the first gate driver circuit is electrically coupled to a first node that outputs a first drive signal,
  wherein the output terminal of the second gate driver circuit is electrically coupled to a second node that outputs a second drive signal,
  wherein the output terminal of the first gate driver circuit is electrically coupled to the input terminal of the second gate driver circuit,
  wherein the output terminal of the second gate driver circuit is electrically coupled to the input terminal of the first gate driver circuit, and
  wherein the enable terminal of the first gate driver circuit is electrically coupled to the signal that is input to the gate driver device; and
  a third gate driver circuit including an input terminal, an enable terminal, and an output terminal,
  wherein a voltage level at the output terminal of the third gate driver circuit depends on a voltage level at the input terminal of the third gate driver circuit and a voltage level at the enable terminal of the third gate driver circuit;
  a fourth gate driver circuit including an input terminal, an enable terminal, and an output terminal,
  wherein a voltage level at the output terminal of the fourth gate driver circuit depends on a voltage level at the input terminal of the fourth gate driver circuit and a voltage level at the enable terminal of the fourth gate driver circuit,
  wherein the output terminal of the third gate driver circuit is electrically coupled to a third node that outputs a third drive signal,
  wherein the output terminal of the fourth gate driver circuit is electrically coupled to a fourth node that outputs a fourth drive signal,
  wherein the output terminal of the third gate driver circuit is electrically coupled to the input terminal of the fourth gate driver circuit,
  wherein the output terminal of the fourth gate driver circuit is electrically coupled to the input terminal of the third gate driver circuit, and
  wherein the enable terminal of the third gate driver circuit is electrically coupled to the signal that is input to the gate driver device.

2. The gate driver device according to claim 1, wherein:
  the first gate driver circuit, in operation, causes the output terminal of the first gate driver circuit to have a first voltage level or a second voltage level that is greater than the first voltage level, the first gate driver circuit causing the output terminal of the first gate driver circuit to have the first voltage level unless the enable terminal of the first gate driver circuit has the second voltage level and the input terminal of the first gate driver circuit simultaneously has the first voltage level,
  the second gate driver circuit, in operation, causes the output terminal of the second gate driver circuit to have the first voltage level or the second voltage level, the second gate driver circuit causing the output terminal of the second gate driver circuit to have the first voltage level unless the enable terminal of the second gate driver circuit has the second voltage level and the input terminal of the second gate driver circuit simultaneously has the first voltage level,
  the third gate driver circuit, in operation, causes the output terminal of the third gate driver circuit to have the first voltage level or the second voltage level, the third gate driver circuit causing the output terminal of the third gate driver circuit to have the first voltage level unless the enable terminal of the third gate driver circuit has the second voltage level and the input terminal of the third gate driver circuit simultaneously has the first voltage level, and
  the fourth gate driver circuit, in operation, causes the output terminal of the fourth gate driver circuit to have the first voltage level or the second voltage level, the fourth gate driver circuit causing the output terminal of the fourth gate driver circuit to have the first voltage level unless the enable terminal of the fourth gate driver circuit has the second voltage level and the input terminal of the fourth gate driver circuit simultaneously has the first voltage level.

3. The gate driver device according to claim 1, further comprising:
  a first keep alive circuit including a first diode, a first capacitor, and a first resistor,
  wherein a first terminal of the first diode is electrically coupled to the output terminal of the first gate driver circuit, and a second terminal of the first diode is electrically coupled to the enable terminal of the second gate driver circuit,
  wherein a first terminal of the first capacitor is electrically coupled to the enable terminal of the second gate driver circuit, and a second terminal of the first capacitor is electrically coupled to a ground terminal of the first gate driver circuit, and
  wherein a first terminal of the first resistor is electrically coupled to the enable terminal of the second gate driver circuit, and a second terminal of the first resistor is electrically coupled to the ground terminal of the first gate driver circuit.

4. The gate driver device according to claim 3, further comprising:
a second keep alive circuit including a second diode, a second capacitor, and a second resistor,
wherein a first terminal of the second diode is electrically coupled to the output terminal of the third gate driver circuit, and a second terminal of the second diode is electrically coupled to the enable terminal of the third gate driver circuit,
wherein a first terminal of the second capacitor is electrically coupled to the enable terminal of the fourth gate driver circuit, and a second terminal of the second capacitor is electrically coupled to a ground terminal of the fourth gate driver circuit, and
wherein a first terminal of the second resistor is electrically coupled to the enable terminal of the fourth gate driver circuit, and a second terminal of the second resistor is electrically coupled to the ground terminal of the fourth gate driver circuit.

5. The gate driver device according to claim 1, further comprising:
a first transformer including a primary coil that is electrically coupled to the signal that is input to the gate driver device and the enable terminal of the first gate driver circuit, and a secondary coil that is electrically coupled to the enable terminal of the third gate driver circuit; and
a second transformer including a primary coil that is electrically coupled to the output terminal of the second gate driver circuit, and a secondary coil that is electrically coupled to the second node that outputs the second drive signal.

6. The gate driver device according to claim 1, further comprising:
a forward converter powertrain including a transformer, a main transistor, an active reset transistor, a forward synchronous transistor, and a catch synchronous transistor,
wherein the transformer includes a primary coil and a secondary coil,
wherein a drain terminal of the main transistor is electrically coupled to a first terminal of the primary coil of the transformer, a source terminal of the main transistor is electrically coupled to a reference potential, and a gate terminal of the main transistor is electrically coupled to the first node that outputs the first drive signal,
wherein a drain terminal of the active reset transistor is electrically coupled to a second terminal of the primary coil of the transformer, a source terminal of the active reset transistor is electrically coupled to the first terminal of the primary coil of the transformer, and a gate terminal of the active reset transistor is electrically coupled to the second node that outputs the second drive signal,
wherein a drain terminal of the forward synchronous transistor is electrically coupled to a first terminal of the secondary coil of the transformer, and a gate terminal of the forward synchronous transistor is electrically coupled to the third node that outputs the third drive signal, and
wherein a drain terminal of the catch synchronous transistor is electrically coupled to a second terminal of the secondary coil of the transformer, a source terminal of the catch synchronous transistor is electrically coupled to a source terminal of the forward synchronous transistor, and a gate terminal of the catch synchronous transistor is electrically coupled to the fourth node that outputs the fourth drive signal.

7. The gate driver device according to claim 6, wherein:
each of the main transistor, the active reset transistor, the forward synchronous transistor, and the catch synchronous transistor is a same type of transistor.

8. The gate driver device according to claim 1, wherein:
the first gate driver circuit and the second gate driver circuit are included in a first integrated logic driver that is provided in a first integrated circuit chip, and
the third gate driver circuit and the fourth gate driver circuit are included in a second integrated logic driver that is provided in a second integrated circuit chip.

9. A gate driver device that outputs a plurality of drive signals based on a signal that is input to the gate driver device, the gate driver device comprising:
a first gate driver circuit including an input terminal, an enable terminal, and an output terminal,
wherein a voltage level at the output terminal of the first gate driver circuit depends on a voltage level at the input terminal of the first gate driver circuit and a voltage level at the enable terminal of the first gate driver circuit, and
wherein the output terminal of the first gate driver circuit is electrically coupled to a first node that outputs a first drive signal;
a second gate driver circuit including an input terminal, an enable terminal, and an output terminal,
wherein a voltage level at the output terminal of the second gate driver circuit depends on a voltage level at the input terminal of the second gate driver circuit and a voltage level at the enable terminal of the second gate driver circuit, and
wherein the output terminal of the second gate driver circuit is electrically coupled to a second node that outputs a second drive signal;
a third gate driver circuit including an input terminal, an enable terminal, and an output terminal,
wherein a voltage level at the output terminal of the third gate driver circuit depends on a voltage level at the input terminal of the third gate driver circuit and a voltage level at the enable terminal of the third gate driver circuit, and
wherein the output terminal of the third gate driver circuit is electrically coupled to a third node that outputs a third drive signal;
a fourth gate driver circuit including an input terminal, an enable terminal, and an output terminal,
wherein a voltage level at the output terminal of the fourth gate driver circuit depends on a voltage level at the input terminal of the fourth gate driver circuit and a voltage level at the enable terminal of the fourth gate driver circuit, and
wherein the output terminal of the fourth gate driver circuit is electrically coupled to a fourth node that outputs a fourth drive signal;
a first keep alive circuit including a first diode, a first capacitor, and a first resistor,
wherein a first terminal of the first diode is electrically coupled to the output terminal of the first gate driver circuit, and a second terminal of the first diode is electrically coupled to the enable terminal of the second gate driver circuit, wherein a first terminal of the first capacitor is electrically coupled to the enable terminal of the second gate driver circuit, and a second terminal of the first capacitor is electrically coupled to a ground terminal of the second gate driver circuit, and wherein a first terminal of the first resistor is electrically coupled to the enable terminal of the second gate driver circuit, and a second terminal of the first resistor is electrically coupled to the ground terminal of the second gate driver circuit; and a second keep alive circuit including a second diode, a second capacitor, and a second resistor, wherein a first terminal of the second diode is electrically coupled to the output terminal of the third gate driver circuit, and a second terminal of the second diode is electrically coupled to the enable terminal of the fourth gate driver circuit, wherein a first terminal of the second capacitor is electrically coupled to the enable terminal of the fourth gate driver circuit, and a second terminal of the second capacitor is electrically coupled to a ground terminal of the fourth gate driver circuit, and wherein a first terminal of the second resistor is electrically coupled to the enable terminal of the fourth gate driver circuit, and a second terminal of the second resistor is electrically coupled to the ground terminal of the fourth gate driver circuit.

10. The gate driver device according to claim 9, wherein:
the output terminal of the first gate driver circuit is electrically coupled to the input terminal of the second gate driver circuit,
the output terminal of the second gate driver circuit is electrically coupled to the input terminal of the first gate driver circuit,
the output terminal of the third gate driver circuit is electrically coupled to the input terminal of the fourth gate driver circuit, and
the output terminal of the fourth gate driver circuit is electrically coupled to the input terminal of the third gate driver circuit.

11. The gate driver device according to claim 9, further comprising:
a first transformer including a primary coil that is electrically coupled to the signal that is input to the gate driver device and the enable terminal of the first gate driver circuit, and a secondary coil that is electrically coupled to the enable terminal of the third gate driver circuit; and
a second transformer including a primary coil that is electrically coupled to the output terminal of the second gate driver circuit, and a secondary coil that is electrically coupled to the second node that outputs the second drive signal.

12. The gate driver device according to claim 9, further comprising:
a forward converter powertrain including a transformer, a main transistor, an active reset transistor, a forward synchronous transistor, and a catch synchronous transistor,
wherein the transformer includes a primary coil and a secondary coil,
wherein a drain terminal of the main transistor is electrically coupled to a first terminal of the primary coil of the transformer, a source terminal of the main transistor is electrically coupled to a reference potential, and a gate terminal of the main transistor is electrically coupled to the first node that outputs the first drive signal, wherein a drain terminal of the active reset transistor is electrically coupled to a second terminal of the primary coil of the transformer, a source terminal of the active reset transistor is electrically coupled to the first terminal of the primary coil of the transformer, and a gate terminal of the active reset transistor is electrically coupled to the second node that outputs the second drive signal, wherein a drain terminal of the forward synchronous transistor is electrically coupled to a first terminal of the secondary coil of the transformer, and a gate terminal of the forward synchronous transistor is electrically coupled to the third node that outputs the third drive signal, and wherein a drain terminal of the catch synchronous transistor is electrically coupled to a second terminal of the secondary coil of the transformer, a source terminal of the catch synchronous transistor is electrically coupled to a source terminal of the forward synchronous transistor, and a gate terminal of the catch synchronous transistor is electrically coupled to the fourth node that outputs the fourth drive signal.

13. The gate driver device according to claim 12, wherein:
each of the main transistor, the active reset transistor, the forward synchronous transistor, and the catch synchronous transistor is a same type of transistor.

14. A method of operating a gate driver device, the method comprising:
providing an input signal to a first gate driver circuit including an input terminal, an enable terminal, and an output terminal,
wherein the input signal is provided to the enable terminal of the first gate driver circuit,
wherein a voltage level at the output terminal of the first gate driver circuit depends on a voltage level at the input terminal of the first gate driver circuit and a voltage level at the enable terminal of the first gate driver circuit,
wherein the output terminal of the first gate driver circuit is electrically coupled to a second gate driver circuit including an input terminal, an enable terminal, and an output terminal,
wherein the output terminal of the first gate driver circuit is electrically coupled to the enable terminal of the second gate driver circuit, and wherein a voltage level at the output terminal of the second gate driver circuit depends on a voltage level at the input terminal of the second gate driver circuit and a voltage level at the enable terminal of the second gate driver circuit,
wherein the output terminal of the second gate driver circuit is electrically coupled to the input terminal of the first gate driver circuit,
wherein the output terminal of the first gate driver circuit is electrically coupled to a first node, and
wherein the output terminal of the second gate driver circuit is electrically coupled to a second node;
outputting a first drive signal from the first node;
outputting a second drive signal from the second node;
providing the input signal to a third gate driver circuit including an input terminal, an enable terminal, and an output terminal,
wherein the input signal is provided to the enable terminal of the third gate driver circuit, wherein a voltage level at the output terminal of the third gate driver circuit depends on a voltage level at the input terminal of the third gate driver circuit and a voltage level at the enable terminal of the third gate driver circuit, wherein the output terminal of the third gate driver circuit is electrically coupled to a fourth gate driver circuit including an input terminal, an enable terminal, and an output terminal, wherein the output terminal of the third gate driver circuit is electrically coupled to the input terminal of the fourth gate driver circuit, wherein a voltage level at the output terminal of the fourth gate driver circuit depends on a voltage level at the input terminal of the fourth gate driver circuit and a voltage level at the enable terminal of the fourth gate driver circuit, wherein the output terminal of the fourth gate driver circuit is electrically coupled to the input terminal of the third gate driver circuit, wherein the output terminal of the third gate driver circuit is electrically coupled a third node, and wherein the output terminal of the fourth gate driver circuit is electrically coupled to a fourth node;

outputting a third drive signal from the third node; and outputting a fourth drive signal from the fourth node.

15. The method according to claim 14, further comprising:

causing the output terminal of the first gate driver circuit to have a first voltage level or a second voltage level that is greater than the first voltage level, including causing the output terminal of the first gate driver circuit to have the first voltage level unless the enable terminal of the first gate driver circuit has the second voltage level and the input terminal of the first gate driver circuit simultaneously has the first voltage level;

causing the output terminal of the second gate driver circuit to have the first voltage level or the second voltage level, including causing the output terminal of the second gate driver circuit to have the first voltage level unless the enable terminal of the second gate driver circuit has the second voltage level and the input terminal of the second gate driver circuit simultaneously has the first voltage level;

causing the output terminal of the third gate driver circuit to have the first voltage level or the second voltage level, including causing the output terminal of the third gate driver circuit to have the first voltage level unless the enable terminal of the third gate driver circuit has the second voltage level and the input terminal of the third gate driver circuit simultaneously has the first voltage level; and causing the output terminal of the fourth gate driver circuit to have the first voltage level or the second voltage level, including causing the output terminal of the fourth gate driver circuit to have the first voltage level unless the enable terminal of the fourth gate driver circuit has the second voltage level and the input terminal of the fourth gate driver circuit simultaneously has the first voltage level.

16. The method according to claim 14, wherein:

the first drive signal has a first voltage level while the second drive signal has a second voltage level different from the first voltage level.

17. The method according to claim 16, wherein:

the first drive signal has the second voltage level while the second drive signal has the first voltage level.

18. The method according to claim 16, wherein:

the third drive signal has the first voltage level while the fourth drive signal has the second voltage level.

19. The method according to claim 18, wherein:

the third drive signal has the second voltage level while the fourth drive signal has the first voltage level.

20. The method according to claim 16, wherein:

the first drive signal has a first voltage level while the second drive signal has a second voltage level different from the first voltage level, the first drive signal has the second voltage level while the second drive signal has the first voltage level, the third drive signal has the first voltage level while the fourth drive signal has the second voltage level, and the third drive signal has the second voltage level while the fourth drive signal has the first voltage level.

\* \* \* \* \*